United States Patent
Zubkow et al.

(10) Patent No.: US 7,683,727 B2
(45) Date of Patent: Mar. 23, 2010

(54) ACCELERATION FEEDBACK CONTROL FOR CRYSTAL OSCILLATORS

(75) Inventors: Zygmunt Zubkow, Palm Harbor, FL (US); Oneika L. Tyler, St. Petersburg, FL (US)

(73) Assignee: Honeywell International Inc., Morristown, NJ (US)

( * ) Notice: Subject to any disclaimer, the term of this patent is extended or adjusted under 35 U.S.C. 154(b) by 210 days.

(21) Appl. No.: 11/686,643

(22) Filed: Mar. 15, 2007

(65) Prior Publication Data
US 2008/0224787 A1    Sep. 18, 2008

(51) Int. Cl.
*H03L 1/00*    (2006.01)
(52) U.S. Cl. .......................... 331/65; 331/70; 331/158; 331/175; 331/176
(58) Field of Classification Search .................. 331/65, 331/70, 158, 175, 176
See application file for complete search history.

(56) References Cited

U.S. PATENT DOCUMENTS

| | | | |
|---|---|---|---|
| 6,147,565 A | 11/2000 | Satoh et al. | |
| 6,501,340 B1 | 12/2002 | Flood | |
| 6,707,346 B2 * | 3/2004 | Tillotson et al. | ............ 331/175 |
| 6,731,180 B1 | 5/2004 | Clark et al. | |
| 7,088,032 B2 | 8/2006 | Oita et al. | |

* cited by examiner

*Primary Examiner*—Robert Pascal
*Assistant Examiner*—James E Goodley
(74) *Attorney, Agent, or Firm*—Fogg & Powers LLC

(57) ABSTRACT

Methods and apparatus for controlling frequency in a crystal oscillator are provided that allows for continued reception of GPS signal solution in a continuous high G environment. One method comprises measuring G-forces asserted on the crystal oscillator, determining a shift in frequency of the crystal oscillator due to the measured G-forces, determining a temperature that would shift the crystal oscillator's frequency back to a rate that would occur without the measured G-forces, and changing the temperature of the crystal oscillator based on the determined temperature to shift the crystal oscillator's frequency back to a rate that would occur if the G-forces were not present.

20 Claims, 2 Drawing Sheets

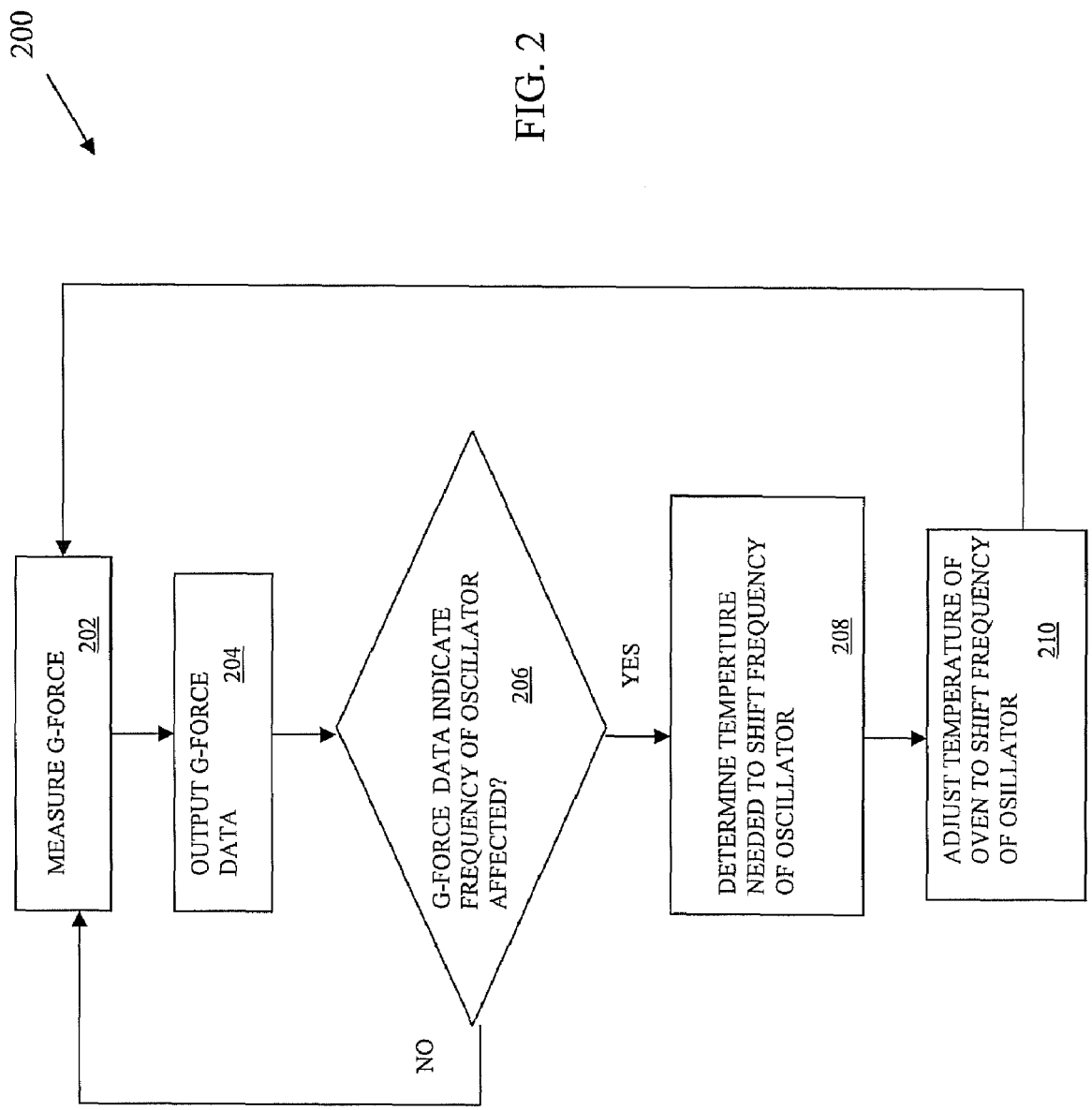

ACCELERATION FEEDBACK CONTROL FOR CRYSTAL OSCILLATORS

BACKGROUND

It is common for aeronautical devices to employ Global Positioning Systems (GPS) for navigational purposes. One common component of a GPS system is a crystal oscillator that provides electrical oscillations (clock signals) for use by components of the GPS at a frequency that is defined by the physical characteristics of a piezoelectric quartz crystal. In high spin aero-space devices that maintain a relative high acceleration, crystal oscillators exhibit a susceptibility to the associated G-forces. As the result of the susceptibility to G-forces, there is a shift in the fundamental frequency of the crystal oscillator. In continuous high G-force environments, this becomes a significant source of error. For example, since accurate timing of sent and received signals between the GPS and satellites is needed to determine location, any shift in frequency of the crystal oscillator that provides the timing will effect the determination of the location. Frequency error of the crystal oscillator cannot be easily detected or compensated for using current techniques. For example, monitoring the frequency of the crystal oscillator is difficult since a device used to compare frequencies (which would include another crystal oscillator) would also be affected by the G-forces.

For the reasons stated above and for other reasons stated below which will become apparent to those skilled in the art upon reading and understanding the present specification, there is a need in the art for a system for effectively and efficiently compensating for the effects of G forces on crystal oscillators so that a desired frequency of the crystal oscillator is maintained.

SUMMARY OF INVENTION

The above-mentioned problems of current systems are addressed by embodiments of the present invention and will be understood by reading and studying the following specification. The following summary is made by way of example and not by way of limitation. It is merely provided to aid the reader in understanding some of the aspects of the invention.

In one embodiment, a method of controlling frequency in a crystal oscillator is provided. The method comprises measuring G-forces asserted on the crystal oscillator, determining a shift in frequency of the crystal oscillator due to the measured G-forces, determining a temperature that would shift the crystal oscillator's frequency back to a rate that would occur without the measured G-forces, and changing the temperature of the crystal oscillator based on the determined temperature to shift the crystal oscillator's frequency back to a rate that would occur if the G-forces were not present.

BRIEF DESCRIPTION OF THE DRAWINGS

The present invention can be more easily understood and further advantages and uses thereof more readily apparent, when considered in view of the detailed description and the following figures in which:

FIG. 2 is a frequency control flow diagram illustrating one method of one embodiment of the present invention.

In accordance with common practice, the various described features are not drawn to scale but are drawn to emphasize specific features relevant to the present invention. Reference characters denote like elements throughout Figures and text.

DETAILED DESCRIPTION

Figure 1:
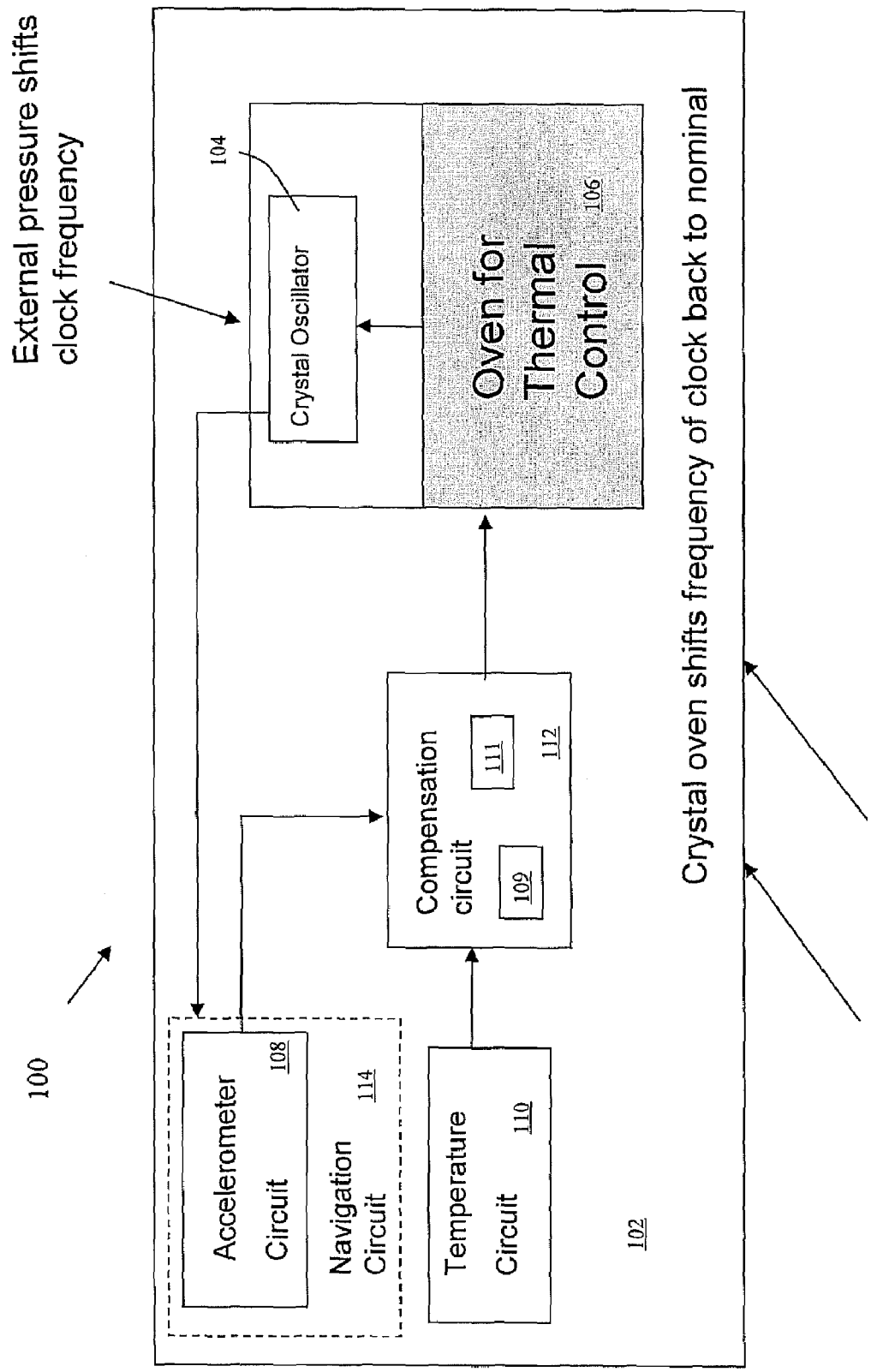
FIG. 1 is a block diagram of a device subject to G-forces of one embodiment of the present invention.

In the following detailed description, reference is made to the accompanying drawings, which form a part hereof, and in which is shown by way of illustration specific embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and equivalents thereof.

Embodiments of the present invention provide a system and method to maintain a desired frequency of a crystal oscillator in a relatively high spin vehicle. In embodiments, acceleration of the vehicle is monitored. Based on the monitored acceleration and known relationships between G-forces Vs. frequency and temperature Vs. frequency of crystal oscillators, the temperature of the crystal oscillator is adjusted to main a desired frequency.

Referring to FIG. 1, a device 100 that is subject to G-forces with a frequency control system of one embodiment of the present invention is illustrated. In this embodiment, a high spin vehicle 102 includes a crystal oscillator 104, an oven 106, an accelerometer circuit 108, a temperature circuit 110 and a compensation circuit 112. As illustrated in FIG. 1, external pressures (G-forces) from vehicle spin due to centripetal and centrifugal accelerations are exerted on the vehicle 102. The external pressure shifts the clock frequency of the crystal oscillator 104 away from its desired frequency. The affects of G-forces on the frequency of crystal oscillators (G-force Vs. frequency) are known in the art.

The accelerometer circuit 108 measures the amount of G-forces being applied to the vehicle 102. In one embodiment, the accelerometer circuit 108 includes three orthogonal accelerometers and gyros that determine the G-force on the crystal. The accelerometer circuit 108 outputs an accelerometer measurement signal to the compensation circuit 112. The temperature circuit 110 monitors the temperature of the crystal oscillator 104. The relationship between a temperature of a crystal oscillator 104 and the frequency of the crystal oscillator (temperature Vs frequency) is also well known in the art. In fact, it is common to use oscillator ovens (such as oven 106) in vehicles with GPS/INS navigation systems to control the frequency of the crystal oscillator in order to maintain a precise lock on satellites. The temperature circuit outputs a temperature measurement signal to the compensation circuit 112.

The compensation circuit 112 takes the accelerometer measurement signal which is present in a GPS/INS (Inertial Navigation System), and determines if the current G-force has affected the frequency of the crystal oscillator 104 and by how much. In one embodiment this in done with a processor 109. Moreover, in one embodiment, the processor 109 uses data from a stored table that sets out G-force Vs. frequency affects. Hence in one embodiment, the compensation circuit 112 includes a memory 111 to store relationship tables. If the processor determines a frequency shift has occurred due to G-forces based on the accelerometer measurement signal and the G-force Vs. frequency table, the processor then determines what temperature is needed to shift the frequency back to the desired frequency. This is done by looking at the temperature Vs frequency relationship of crystal oscillators. In one embodiment, a temperature Vs frequency table is stored in the memory 111. In this embodiment, the processor 109 simply looks at the temperature Vs frequency table to determine the temperature needed to shift the frequency back to the desired frequency. Once a temperature needed to shift the frequency back to the desired frequency has been determined, a control signal is sent to the oven 106. In one embodiment, a compensation voltage is the signal used to control the oven 106. The oven 104, in response to the control signal from the compensation circuit 112 heats or cools the crystal oscillator 104 accordingly. Hence, in embodiments of the present invention, the temperature of the oven 106 is controlled via accelerometer feedback to keep the oscillator frequency constant.

In one embodiment, a navigation circuit 114 is included. The navigation circuit 114 is also illustrated in FIG. 1. The navigation circuit 114 is used to navigate the device 100 that is subject to G-forces. The navigation circuit 114 in one embodiment includes global positioning systems (GPS). In yet another embodiment, the navigation circuit 114 includes inertial navigation system (INS). In still another embodiment, the navigation circuit includes both GPS and INS. The GPS and INS use data from the accelerometer circuit 108 for navigation. In one embodiment, the accelerometer circuit 108 includes three orthogonal accelerometers and gyros that determine G-force. The navigation circuit 104 uses a clock (or frequency signal) from the crystal oscillator 104 for timing reasons. For example, with GPS precision timing between sent signals and received signals from satellites is needed to determine location. If the crystal oscillator's frequency is shifted because of G-forces, the timing will be off and a wrong location will be determined. Hence, the embodiments of the present invention maintain the frequency of the crystal oscillator at a desired frequency so that accurate timing by components using the frequency signal can occur.

Referring to FIG. 2, a frequency control flow diagram 200 illustrating one method of implementing one embodiment of the present invention is illustrated. As illustrated, the process starts by measuring G-forces being applied to a vehicle (202). As discussed above, in one embodiment this is done with an accelerometer circuit. Data regarding the measured G-force is then output to a compensation circuit (204). It is then determined if the G-force is strong enough to shift the frequency of the oscillator (206). If it is not strong enough to shift the frequency (206), the G-force is continued to be measured at (202). If the G-force is strong enough to shift the frequency of the oscillator (206), it is then determined what temperature of the crystal is needed to counteract the frequency shift (208). As discussed above, in embodiments of the present invention, this is done with use of G-force Vs. frequency and temperature Vs frequency tables. Once the temperature is determined (208), the crystal oven is adjusted accordingly (210). This shifts the frequency back to a desired frequency.

The methods and techniques described here may be implemented in digital electronic circuitry, or with a programmable processor (for example, a special-purpose processor or a general-purpose processor such as a computer) firmware, software, or in combinations of them generally defined as modules. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs).

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

The invention claimed is:

1. A method of controlling frequency in a crystal oscillator, the method comprising:
   measuring G-forces asserted on the crystal oscillator;
   determining a shift in frequency of the crystal oscillator due to the measured G-forces;
   determining a temperature that would shift the crystal oscillator's frequency back to a rate that would occur without the measured G-forces; and
   compensating for the shift in frequency of the crystal oscillator due to measuring non-zero G-forces by changing the temperature of the crystal oscillator.

2. The method of claim 1, further comprising:
   determining if the measured G-forces will affect the crystal oscillator's frequency.

3. The method of claim 1, wherein changing the temperature of the crystal oscillator further comprises one of raising the temperature and lowering the temperature of the crystal oscillator.

4. The method of claim 1, wherein the measuring the G-forces further comprises:
   using accelerometers to measure the G-forces.

5. The method of claim 4, wherein using accelerometers to measure the G-forces, further comprises:
   using three orthogonal accelerometers and gyros to determine the G-forces on the crystal oscillator.

6. The method of claim 1, wherein changing the temperature of the crystal oscillator further comprises:
   applying a determined compensation voltage to a crystal oven.

7. The method of claim 1, further comprising:
   storing data relating to G-forces Vs. crystal oscillator frequency; and
   storing data relating to temperature Vs. crystal oscillator frequency.

8. The method of claim 7, wherein determining the shift in frequency based on the measured G-force further comprises:
   comparing the measured G-force with the stored data relating to G-Force Vs. crystal oscillator frequency.

9. The method of claim 7, wherein determining the temperature that would shift the crystal oscillator's frequency back to the rate that would occur without the measured G-forces further comprises:
comparing the determined frequency shift caused by the G-force with the stored data relating to temperature Vs. crystal oscillator frequency.

10. A device that is subject to G-forces, the device comprising:
a crystal oscillator configured to output a clock signal at a given frequency;
a crystal oven configured to regulate the temperature of the crystal oscillator to regulate the given frequency;
at least one accelerometer configured to measure G-forces and provide an accelerometer output based on the measured G-force; and
a feedback loop configured to provide an oven control signal to the crystal oven based at least in part on the accelerometer output.

11. The device of claim 10, wherein the at least one accelerometer further comprises:
three orthogonal accelerometers.

12. The device of claim 11, further comprising:
at least one gyro.

13. The device of claim 11, further comprising:
a temperature circuit configured to measure the temperature of the crystal oscillator.

14. The device of claim 13, wherein the feedback loop further comprises:
a compensation circuit configured to output the oven control signal based on a comparison of G-forces Vs. crystal oscillator frequency and temperature Vs. crystal oscillator frequency.

15. The device of claim 14, wherein the compensation circuit further comprises:
a memory configured to store the G-forces Vs. crystal oscillator frequency and the temperature Vs crystal oscillator frequency data; and
a processor configured to generate the oven control signal based on the accelerometer output, the measured temperature and the G-forces Vs. crystal oscillator frequency and temperature Vs crystal oscillator frequency data stored in the memory.

16. A high spin vehicle, the vehicle comprising: a crystal oscillator configured to output a clock signal at a given frequency;
a navigation circuit configured to navigate the high spin vehicle, the navigation circuit configured to use the clock signal from the crystal oscillator for navigation;
a crystal oven configured to regulate the temperature of the crystal oscillator to regulate the given frequency;
an accelerometer circuit configured to determine G-forces and output an accelerometer signal that is indicative of the determined G-forces;
a temperature circuit configured to measure the current temperature of the crystal oscillator and output a temperature signal indicative of the measured temperature; and
a compensation circuit configured to control the crystal oven based on the accelerometer signal, the temperature signal and G-forces Vs. crystal oscillator frequency and temperature Vs. crystal oscillator frequency data.

17. The vehicle of claim 16, wherein the accelerometer circuit further comprises:
at least one accelerometer.

18. The vehicle of claim 16, wherein the compensation circuit further includes:
a memory configured to store G-forces Vs. crystal oscillator frequency and the temperature Vs. crystal oscillator frequency data; and
a processor configured to process determined G-forces, temperatures and G-forces Vs. crystal oscillator frequency and the temperature Vs. crystal oscillator frequency data to determine a temperature needed to counteract the measured G-forces.

19. The vehicle of claim 16, wherein the navigation circuit further includes at least one of a global positioning system (GPS) and an inertial navigation system (INS).

20. The vehicle of claim 19, wherein the accelerometer circuit further comprises:
three accelerometers; and
three gyros.

* * * * *